United States Patent
Van Der Zaag et al.

(10) Patent No.: US 7,524,688 B2
(45) Date of Patent: Apr. 28, 2009

(54) ACTIVE MATRIX DISPLAY DEVICES AND THE MANUFACTURE THEREOF

(75) Inventors: Pieter J. Van Der Zaag, Seoul (KR); Soo Y. Yoon, Kyunggi-Do (KR); Nigel D. Young, Redhill (GB)

(73) Assignee: TPO Hong Kong Holding Limited, Shatin (HK)

( * ) Notice: Subject to any disclaimer, the term of this patent is extended or adjusted under 35 U.S.C. 154(b) by 708 days.

(21) Appl. No.: 10/515,163

(22) PCT Filed: May 15, 2003

(86) PCT No.: PCT/IB03/02063

§ 371 (c)(1),
(2), (4) Date: Nov. 19, 2004

(87) PCT Pub. No.: WO03/098671

PCT Pub. Date: Nov. 27, 2003

(65) Prior Publication Data

US 2006/0054896 A1    Mar. 16, 2006

(30) Foreign Application Priority Data

May 22, 2002 (GB) .................................. 0211724.0
Oct. 2, 2002 (GB) .................................. 0222758.5

(51) Int. Cl.
*H01L 21/00* (2006.01)
(52) U.S. Cl. ........................................... 438/30; 257/59
(58) Field of Classification Search .................. 438/30; 257/49
See application file for complete search history.

(56) References Cited

U.S. PATENT DOCUMENTS

| | | | | |
|---|---|---|---|---|
| 5,583,366 A | * | 12/1996 | Nakazawa | .................... 257/66 |
| 5,614,733 A | * | 3/1997 | Zhang et al. | .................... 257/66 |
| 6,023,257 A | * | 2/2000 | Koyama | ....................... 345/58 |
| 6,437,767 B1 | * | 8/2002 | Cairns et al. | ................. 345/100 |
| 2003/0094613 A1 | * | 5/2003 | Joo et al. | ....................... 257/59 |
| 2004/0090583 A1 | * | 5/2004 | Yu | .............................. 349/149 |

* cited by examiner

*Primary Examiner*—Charles D. Garber
*Assistant Examiner*—Kenisha V Ford
(74) *Attorney, Agent, or Firm*—Birch, Stewart, Kolasch & Birch, LLP

(57) ABSTRACT

An active plate (2) for an active matrix display device (16), the active plate (2) comprising a substrate (4), a pixel area (6) and an adjacent drive circuit area (8). Both areas include polycrystalline silicon material formed by a process in which a metal is used to enhance the crystallization process (MIC poly-Si), but only the MIC poly-Si in the drive circuit area (8) is subjected to an irradiation process using an energy beam (10). TFTs are fabricated with MIC poly-Si which have leakage currents in the off state sufficiently low for them to be acceptable for use as switching elements in the pixel area of matrix display devices. As only the drive circuit area (8) need be irradiated to provide poly-Si having the desired mobility, the time taken by the irradiation process can be significantly reduced.

7 Claims, 2 Drawing Sheets

ACTIVE MATRIX DISPLAY DEVICES AND THE MANUFACTURE THEREOF

BACKGROUND OF THE INVENTION

1. Field of the Invention

The present invention relates to active matrix display devices comprising polycrystalline silicon thin film transistors and the manufacture thereof.

2. Background of the Invention

The high carrier mobility of polycrystalline silicon (poly-Si) relative to amorphous silicon (a-Si) makes it an attractive material for use in large area electronic devices such as active matrix liquid crystal displays (AMLCDs) and active matrix polymer LED displays (AMPLEDs). Conventionally, poly-Si films used for example in thin film transistors (TFTs) have been manufactured by solid phase crystallisation (SPC). This involves depositing an a-Si film on an insulating substrate and crystallising the a-Si film by exposing it to a high temperature for a prolonged period of time, that is typically a temperature in excess of 600° C. for up to 24 hours.

As an alternative, U.S. Pat. No. 5,147,826 discloses a lower temperature method of crystallising an a-Si film, comprising the steps of depositing a thin film of nickel for example on the a-Si film and annealing the film. The metal catalyses crystal growth at temperatures below 600° C. and also provides more rapid crystal growth than would otherwise occur. For example, a typical anneal using the method of U.S. Pat. No. 5,147,826 might be at around 550° C. for 10 hours. This represents an improvement over prior methods for at least two reasons: first, it enables low cost non-alkali glass substrates such as borosilicate to be used which would normally suffer glass compaction and warp at temperatures of 600° C. or more; and secondly, as the anneal duration is reduced, the manufacturing throughput rate is increased and therefore the associated manufacturing cost may be reduced. The contents of U.S. Pat. No. 5,147,826 are incorporated herein by reference.

Polycrystalline silicon material formed by a process in which a metal element is used to enhance the crystallisation process, as described in U.S. Pat. No. 5,147,826 for example, is referred to hereinafter as metal induced crystallisation poly-Si or MIC poly-Si.

In known active matrix display devices, the displayed image is created by an array of pixels, distributed in rows and columns over the "pixel area" of a substrate of the device. One or more TFTs are provided in each pixel to control the respective pixel. Integrated drive circuits comprising TFTs are provided in a "drive circuit area" on the same substrate, around the pixel area. Signals defining the images to be displayed are fed to the drive circuits which in turn send signals to the pixels to generate the images. As described in U.S. Pat. No. 5,756,364, it is desirable for the TFTs of the drive circuit area to have a high mobility, whilst in the pixel area, it is more important that the TFTs have a sufficiently small off-current and that the variation in off-current of the TFTs across the display is minimised. The contents of U.S. Pat. No. 5,756,364 are incorporated herein by reference.

U.S. Pat. No. 5,756,364 discloses that the crystallinity of MIC poly-Si may be improved by illuminating it with laser light. It states that TFTs formed in this way have a relatively high mobility of more than 100 cm²/Vs, making them suitable for the drive circuitry of an active matrix display. Such TFTs are said however to have large off-currents that greatly vary from one transistor to another, making them unsuitable for use in the pixel area of a display. It proposes the formation of MIC poly-Si only in the drive circuit area, followed by illumination of the drive circuit and pixel areas with different respective laser illumination energy densities, which forms poly-Si in the pixel area. The TFTs in the drive circuit area have the suitable properties noted above, whilst the TFTs created in the pixel area have a relatively small mobility of less than 20 cm²/Vs, but a small off-current variation. In order to restrict the formation of MIC poly-Si to drive circuit area, a silicon dioxide mask is formed over the pixel area prior to addition of a solution containing the metal element used to enhance the crystallisation process.

SUMMARY OF THE INVENTION

It is an object of the present invention to provide an improved active matrix display device comprising poly-Si with different electrical properties in the drive circuit and pixel areas of the device, and a process for fabricating such a device.

The present invention provides an active plate for an active matrix display device, the active plate comprising a substrate, a pixel area and an adjacent drive circuit area, both areas including MIC poly-Si, with only MIC poly-Si in the drive circuit area having been subjected to an annealing process using an energy beam.

The invention further provides a method of fabricating an active plate for a matrix display device, the active plate having a pixel area and an adjacent drive circuit area, the method comprising the steps of:
  (a) depositing an amorphous silicon film on a substrate;
  (b) adding to the pixel and drive circuit areas a metal element for accelerating crystallisation of amorphous silicon;
  (c) heating the substrate to crystallise amorphous silicon in the film to form MIC poly-Si; and
  (d) irradiating MIC poly-Si in the drive circuit area with an energy beam.

TFTs manufactured using MIC techniques have been hampered by the problem of relatively high leakage currents in their "off" state, making them unsuitable for use in applications such as the pixel area of AMLCDs. The applicant has determined that TFTs may be fabricated with MIC poly-Si which have leakage currents in the off state sufficiently low for them to be acceptable for use as switching elements in the pixel area of matrix display devices.

The applicant has determined that certain combinations of process parameters yield devices with surprisingly good operating characteristics. It is believed that the combination of longer anneal times of 24 hours or more with average nickel concentrations in the polycrystalline silicon material of $10^{18}$ to $5 \times 10^{19}$ atoms/cm³ are particularly beneficial. Preferably, the anneal time is 36 hours or more. Furthermore, the average nickel concentration in the polycrystalline material is preferably in the range $2.5 \times 10^{18}$ to $2.5 \times 10^{19}$ atoms/cm³.

Also, it is thought that the combination of an anneal time of 24 hours or more, with average nickel concentrations in the poly-Si material of $10^{18}$ to $5 \times 10^{19}$ atoms/cm³, and the use of ion implantation to dose the a-Si with nickel leads to substantially improved results. Longer anneal times of 36 hours or more and/or nickel concentrations in the polycrystalline material in the range $2.5 \times 10^{18}$ to $2.5 \times 10^{19}$ atoms/cm³ may also be advantageously employed in this process.

Previously, it has been suggested that unacceptably high leakage currents in poly-Si TFTs formed by MIC processes are caused by the presence of the catalyst ion, for example, nickel. However, the applicant has found that a significant cause of leakage is regions of uncrystallised a-Si remaining after the MIC process. If longer anneal times are employed, crystallisation occurs in two ways so as to reduce the size of or even remove these a-Si regions. During the initial phase of crystallisation, MIC is dominant. The a-Si film is crystallised into needle-like grains by the migration of a $NiSi_2$ silicide phase. However, the $NiSi_2$ precipitates are stopped when they meet other grain boundaries, other Si needles, or the top and bottom of the a-Si surfaces. Thus, this stage ends, leaving small amounts of a-Si between the needle-like grain structures. If annealing is continued, the thickness of the needle-like grains is increased by SPC, thereby reducing the remaining volume of a-Si.

As described above, it has been found that the combination of longer annealing times with other predetermined parameters provides poly-Si material with improved characteristics. The use of longer anneal times is compensated for by the trend in AMLCD manufacture towards the production of smaller display substrates with higher levels of specialised integration of circuitry in poly-Si on the substrate (in personal digital assistants, and mobile telephones for example), as the desire for high throughput of such devices will not be so great. Also batches of smaller displays can be started through the annealing process at intervals to provide the requisite supply of substrates without the use of an impractically large and expensive furnace.

The applicant has also found that the use of metal atoms in the concentration range $1.3 \times 10^{18}$ to $7.5 \times 10^{18}$ atoms/cm$^3$ enables polycrystalline semiconductor TFTs to be formed with leakage properties acceptable for use in the pixel area of an active matrix display device with an annealing process of duration significantly less than previously thought necessary. Such TFTs and methods for their manufacture are described in copending United Kingdom Patent Application No. 0215566.1 (our ref. PHGB 020109), the contents of which are incorporated herein by reference. Whilst an annealing time of 20 hours at a temperature of around 550° C. achieves the desired properties, it has also been realised that the metal concentrations disclosed above enable this time to be reduced to 10 hours or even 8 hours or less at a temperature of 600° C. or less. This leads to substantial productivity and efficiency increases in the manufacturing process.

Preferably, the average concentration of metal atoms in the polycrystalline semiconductor material is in the range $1.9 \times 10^{18}$ atoms/cm$^3$ to $5 \times 10^{18}$ atoms/cm$^3$. More preferably, the average concentration of metal atoms is around $2.5 \times 10^{18}$ atoms/cm$^3$.

Furthermore, it has been found that the application of an electric field to a substrate during the MIC annealing process (often referred to a field enhanced MIC or FEMIC) may accelerate the process, reducing its duration. An example of FEMIC is described in "Electric-field-enhanced crystallization of amorphous silicon" by Jin Jang et al, Nature, Vol. 395, p 481-483, the contents of which are incorporated herein by reference.

It will be appreciated that other metals may be used instead of or together with nickel in MIC processes. For example, one or more elements selected from the group consisting of Ni, Cr, Co, Pd, Pt, Cu, Ag, Au, In, Sn, Pb, As, and Sb may be employed. More preferably, one or more elements from the group Ni, Co and Pd are used.

Ion implantation is preferably used to dose a-Si with metal in a MIC procedure as it affords precise control over dosage, uniformity and ion depth. Nevertheless, other methods may be employed for this purpose. For example, the metal atoms may be applied the a-Si in a solution, typically by a spin-coating process. Other processes include sputtering or sol-gel coating a layer of nickel, and the use of a nickel precursor during the a-Si CVD process.

As MIC poly-Si is formed in both the pixel and drive circuit area in the present invention, this obviates the need for the deposition and patterning of a silicon dioxide mask to restrict the introduction of the metal element used in the MIC process, as is the case in the methods of U.S. Pat. No. 5,756,364. The fabrication process is thereby simplified and made more cost effective.

Furthermore, as only MIC poly-Si in the drive circuit area is subjected to an annealing process using an energy beam, the time taken by this step can be significantly reduced.

Typically, the energy beam will be generated by a laser, but it will be appreciated that other types of radiation may be used, such as infra-red radiation for example.

As noted in U.S. Pat. No. 5,756,364, a pulsed oscillation laser may be used in the laser annealing process. The use of pulses of short duration helps to minimise heating of the display substrate during the crystallisation procedure. is The present inventors have realised that, when a pulsed oscillation laser is used, there may be sufficient variation in the intensity of the energy pulses generated by the laser to lead to significant non-uniformity in the quality of the MIC poly-Si. As noted above, it is particularly important to minimise variations in the properties of the TFTs in the pixel area of a display device to avoid degradation of displayed images. The present invention provides the further advantage that MIC poly-Si can be formed without a laser annealing treatment in areas of the device susceptible to variations resulting from the use of a pulsed laser, such as the pixel area. This is beneficial in the case of an AMPLED, wherein the TFTs in the pixels have an analogue role in controlling the amount of current fed to each PLED.

The drive circuit area of the device may comprise both digital and analogue circuitry. For example, both digital processing circuitry and analogue to digital converters may be provided. Preferably, only the polycrystalline silicon material within the digital circuitry of the drive circuit area has been subjected to a laser annealing process. This is because the analogue circuitry is likely to be more susceptible to variations in the properties of constituent TFTs caused by pulse-to-pulse variations during the laser annealing process.

BRIEF DESCRIPTION OF THE DRAWINGS

Embodiments of the invention will now be described by way of example and with reference to the accompanying schematic drawings, wherein.

It should be noted that the Figures are diagrammatic and not drawn to scale.

DETAILED DESCRIPTION OF THE ILLUSTRATED EMBODIMENTS

Figure 1:
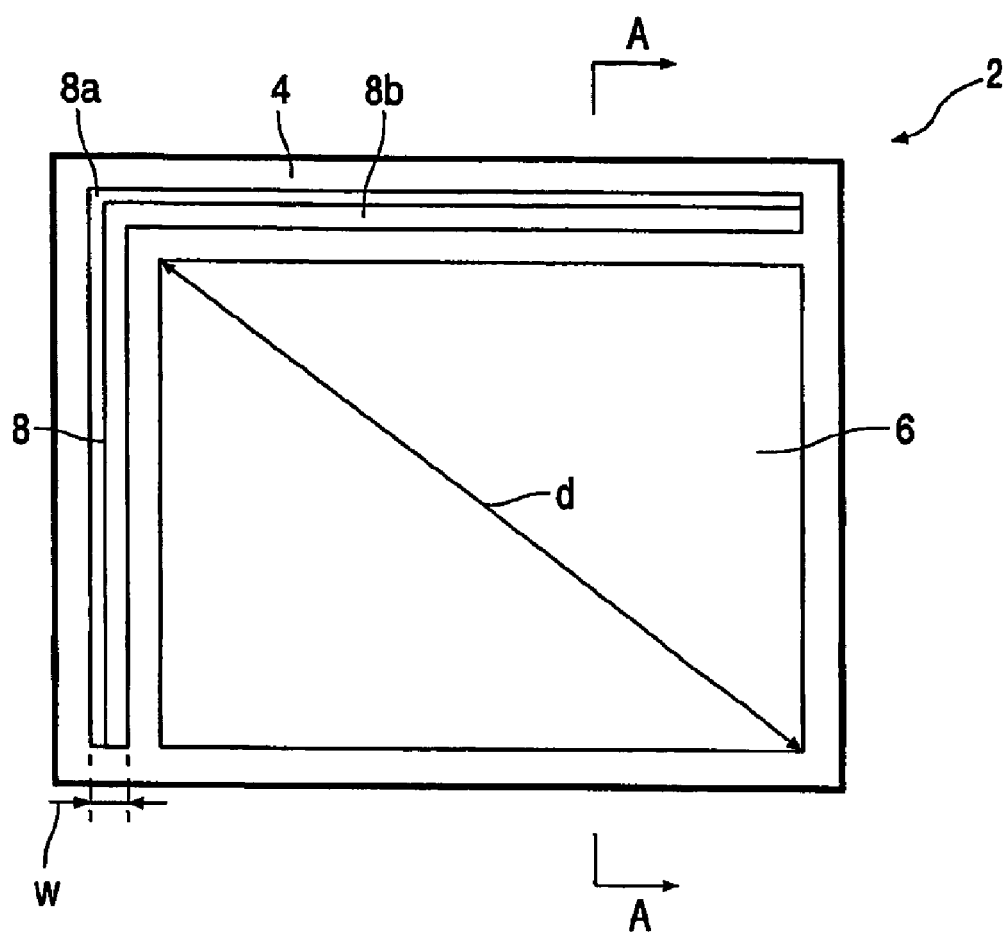
FIG. 1 shows a plan view of the active plate of an active matrix display device according to a first embodiment of the invention.

The active plate 2 of FIG. 1 comprises a substrate 4 for use in an active matrix display, typically formed of glass. On the upper surface thereof are defined a rectangular pixel area 6 and an adjacent peripheral drive circuit area 8 formed of circuitry for driving pixels making up the pixel area. Leads connecting to the substrate and interconnecting the drive and pixel areas are omitted for clarity in the Figure. The width, w, of the elongate peripheral drive circuit area extending along two sides of the pixel area may typically be of the order of 5 mm. The length, d, of a diagonal across the pixel area may vary from around 60 mm for smaller displays used in handheld devices, up to around 430 mm or more for desktop or LC-TV displays. It can therefore be seen that the drive circuit area 8 is a small fraction of the combined area of the pixel and drive circuit areas. As only the drive circuit area or a proportion of it need be subjected to a laser annealing process in accordance with the invention, the time taken for this step can be substantially reduced.

The drive circuit area 8 shown in FIG. 1 comprises regions Ba and 8b where analogue circuitry and digital circuitry, respectively, are provided in the finished display device. In a preferred embodiment, only material in digital circuitry regions 8b is subjected to a laser annealing process, as described above.

A method of forming poly-Si material on a substrate in the configuration shown in FIG. 1 will now be described. Firstly, a layer of silicon dioxide is deposited over the substrate to a depth of around 200 nm, using plasma enhanced chemical vapour deposition (PECVD) for example. A film of amorphous silicon is then deposited by PECVD, which is around 40 nm thick.

An areal density of nickel of around $1 \times 10^{13}$ atoms/cm$^2$ is then implanted into the a-Si layer at an implantation energy typically of 20 keV. Energies of up to 30 keV have been successfully used with layers of this thickness to create TFTs with the desired leakage characteristics. It can be seen that the average concentration of nickel atoms in the 40 nm thick a-Si layer resulting from this dose is therefore around $2.5 \times 10^{18}$ atoms/cm$^3$.

The semiconductor material is crystallised by annealing, preferably in N$_2$ atmosphere, for around 8 hours at 550° C.

The MIC poly-Si film in the drive circuit area 8 is then irradiated using a KrF excimer laser which emits a rectangular beam, for example.

Figure 2:
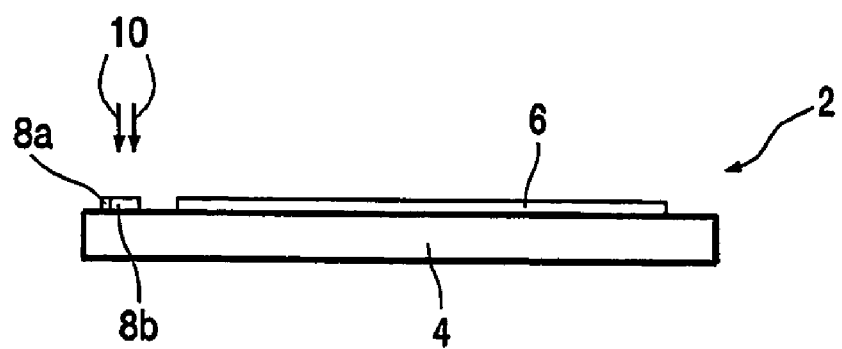
FIG. 2 shows a cross-sectional side view along line A-A of FIG. 1.

FIG. 2 shows a cross-sectional side now along line A-A of FIG. 1. It illustrates the irradiation of digital circuitry region 8b using a laser beam 10, whereas the pixel area 6 and analogue circuitry region 8a are not irradiated with the beam.

The length of the laser beam 10 at the substrate surface is preferably at least as great as the length of the longer of the limbs of the L-shaped drive circuit area. As only the drive circuit area is to be annealed using the laser, irradiation may be carried out by scanning the beam over one of the limbs of the L-shaped drive circuit area, and then rotating the substrate or laser beam through 90 degrees, before scanning the beam over the remainder of the area. Alternatively, after irradiating one limb of the drive circuit area, the beam width may be reduced so that a more intense, narrower beam may be swept more quickly over the remainder of the area, continuing in the same direction.

Figure 3:
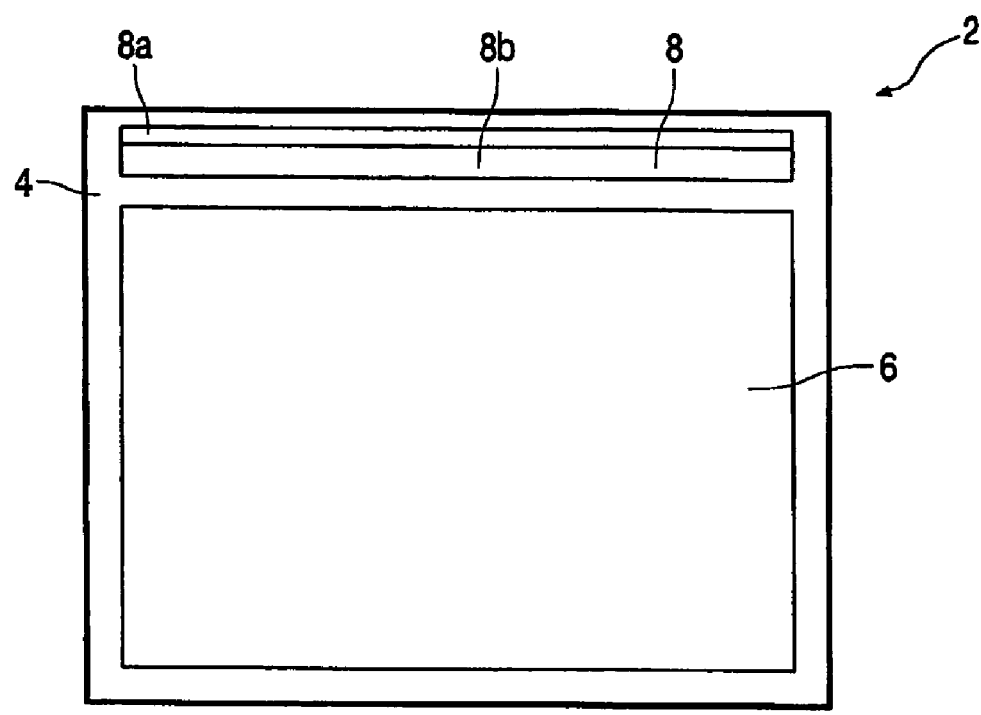
FIG. 3 shows a plan view of the active plate of an active matrix display device according to a second embodiment of the invention.

It will be appreciated that the time taken for the laser annealing process may be further reduced by locating the drive circuitry in a more compact area. Only a single scanning operation in one direction of constant width may then be required. For example, as shown in FIG. 3, the drive circuit area 8 may be provided along one side only of the pixel area 6. Both sets of row and column electrodes may be driven from one side of the display in this way by provision of an additional set of electrodes running from the drive area 8, across the pixel area 6 parallel to the column electrodes, with each of the additional electrodes connecting to a respective row electrode.

The resulting MIC poly-Si material is patterned to define the semiconductor bodies of the TFTs in the drive circuit and pixel areas 8, 6. Photolithography, implantation, deposition and etching process steps may then be carried out in a known manner to form the individual poly-Si TFT structures.

It is preferable to carry out a plasma hydrogenation process after fabrication of the TFTs to improve their performance. It is believed by the inventors that this is especially beneficial for material fabricated by the methods described herein which create poly-Si material films with little or no amorphous material present. Typically, this is carried out at around 350° C. for about 1 hour.

Figure 4:
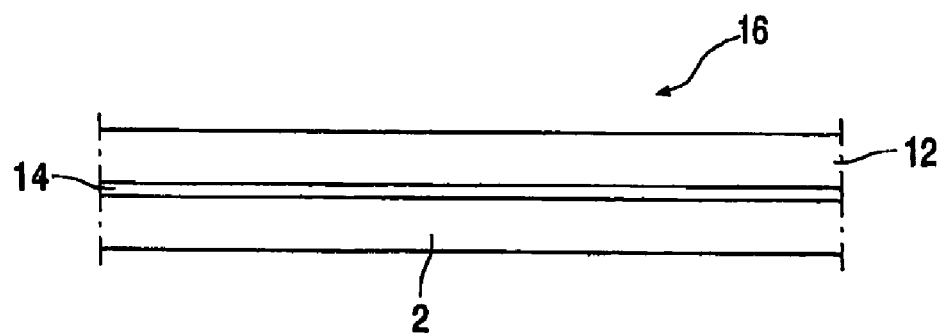
FIG. 4 shows a side view of an active matrix device including an active plate embodying the invention.

An AMLCD 16, as shown in side view in FIG. 4, may be formed in a known manner by sandwiching a layer of liquid crystal material 14 between a completed active plate 2 and a passive plate 12.

Whilst embodiments of the invention are described herein with reference to silicon material, it will be apparent that compound semiconductor films (for example silicon films containing germanium) may be used in accordance with the invention.

In the example described above, the invention is embodied in an AMLCD. It will be appreciated that the invention may also be advantageously employed in other active matrix display devices such as AMPLEDs, which include switching matrices and integrated circuitry on the same substrate.

From reading the present disclosure, other variations and modifications will be apparent to persons skilled in the art. Such variations and modifications may involve equivalent and other features which are already known in the art, and which may be used instead of or in addition to features already described herein.

Although claims have been formulated in this application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

The applicant hereby give notice that new claims may be formulated to such features and/or combinations of such features during the prosecution of the present application or of any further application derived therefrom.

The invention claimed is:

1. An active plate for an active matrix display device, the active plate comprising
a substrate, a pixel area and an adjacent drive circuit area, each of the pixel area and the drive circuit area including MIC poly-Si, the drive circuit area comprising a digital circuitry region and an analogue circuitry region, each of the digital circuitry region and the analogue circuitry region including MIC poly-Si, with only MIC poly-Si in the digital circuitry region of the drive circuit area having been subject to an annealing process using an energy beam.

2. The active plate of claim 1, wherein substantially all the MIC poly-Si of the drive circuit area is located to one side of the pixel area.

3. The active plate of claim 1, wherein the MIC poly-Si includes nickel at a concentration in the range of $1.3 \times 10^{18}$ to $7.5 \times 10^{18}$ atoms/cm$^3$.

4. The active plate of claim 3, wherein the MIC poly-Si includes nickel at a concentration around $2.5 \times 10^{18}$ atoms/cm$^3$.

5. A method of fabricating an active plate for a matrix display device, the active plate having a pixel area and an adjacent drive circuit area, the method comprising the steps of:
- (a) depositing an amorphous silicon film on a substrate;
- (b) adding to the pixel area and drive circuit area a metal element for accelerating crystallisation of amorphous silicon;
- (c) heating the substrate to crystallise amorphous silicon in the film to form MIC poly-Si; and
- (d) irradiating only MIC poly-Si in a digital circuitry region of the drive circuit area with an energy beam.

6. The method of claim 5, wherein in step (b) the metal element is nickel and it is added to the amorphous silicon film at a concentration in the range $1.3\times10^{18}$ to $7.5\times10^{18}$ atoms/cm$^3$.

7. The method of claim 6, wherein in step (b) the metal element is nickel and it is added to the amorphous silicon film at a concentration around $2.5\times10^{18}$ atoms/cm$^3$.

* * * * *